(12) United States Patent
Aihara

(10) Patent No.: US 10,041,996 B2
(45) Date of Patent: Aug. 7, 2018

(54) CONTACT MODULE FOR ELECTRONIC COMPONENTS MEASUREMENT

(71) Applicant: SYNAX CO., LTD., Matsumoto-shi, Nagano-ken (JP)

(72) Inventor: Takamitsu Aihara, Koriyama (JP)

(73) Assignee: Synax Co., Ltd. (JP)

( * ) Notice: Subject to any disclaimer, the term of this patent is extended or adjusted under 35 U.S.C. 154(b) by 225 days.

(21) Appl. No.: 14/705,233

(22) Filed: May 6, 2015

(65) Prior Publication Data

US 2015/0323565 A1  Nov. 12, 2015

(30) Foreign Application Priority Data

May 7, 2014 (JP) .................................. 2014-095972

(51) Int. Cl.
*G01R 31/20* (2006.01)
*G01R 31/28* (2006.01)
*G01R 1/04* (2006.01)

(52) U.S. Cl.
CPC ....... *G01R 31/2893* (2013.01); *G01R 1/0466* (2013.01); *G01R 31/2891* (2013.01)

(58) Field of Classification Search
None
See application file for complete search history.

(56) References Cited

U.S. PATENT DOCUMENTS

| 6,076,394 A | * | 6/2000 | Tsuda | H05K 13/0408 414/225.01 |
| 7,309,981 B2 | * | 12/2007 | Yamashita | G01R 31/2851 324/750.03 |
| 2003/0012633 A1 | * | 1/2003 | Harada | G01R 31/01 414/783 |
| 2013/0181576 A1 | * | 7/2013 | Shiozawa | H02N 2/0095 310/323.17 |

FOREIGN PATENT DOCUMENTS

| JP | H10-239390 A | 9/1998 |
| JP | 2006-029943 A | 2/2006 |
| JP | 2008-190894 A | 8/2008 |
| JP | 2012-109300 A | 6/2012 |
| JP | 2013-044684 A | 3/2013 |
| TW | 200511543 A | 3/2005 |
| WO | WO-2005-008726 A2 | 1/2005 |

OTHER PUBLICATIONS

Soko JP 2013044684 "Handler and Component Inspection Apparatus", English Machine Translation, Published Mar. 4, 2013).*
Japanese Office Action for Application No. 2014-095972 dated May 12, 2015 with English translation (4 pages).
Taiwan Office Action for Application No. 104113737 dated Jan. 22, 2016 w/ English translation (13 pages).

* cited by examiner

*Primary Examiner* — Daniel Miller
(74) *Attorney, Agent, or Firm* — Harness, Dickey & Pierce, P.L.C.

(57) ABSTRACT

When a pressure plate is positioned above an electronic component placed in a measurement socket of an electronic- (Continued)

component measurement apparatus, a cam-follower drive mechanism of a measurement pressure mechanism is horizontally driven to lower the pressure plate via a cam block, whereby the pressure plate presses the electronic component against the measurement socket at a predetermined pressure.

9 Claims, 11 Drawing Sheets

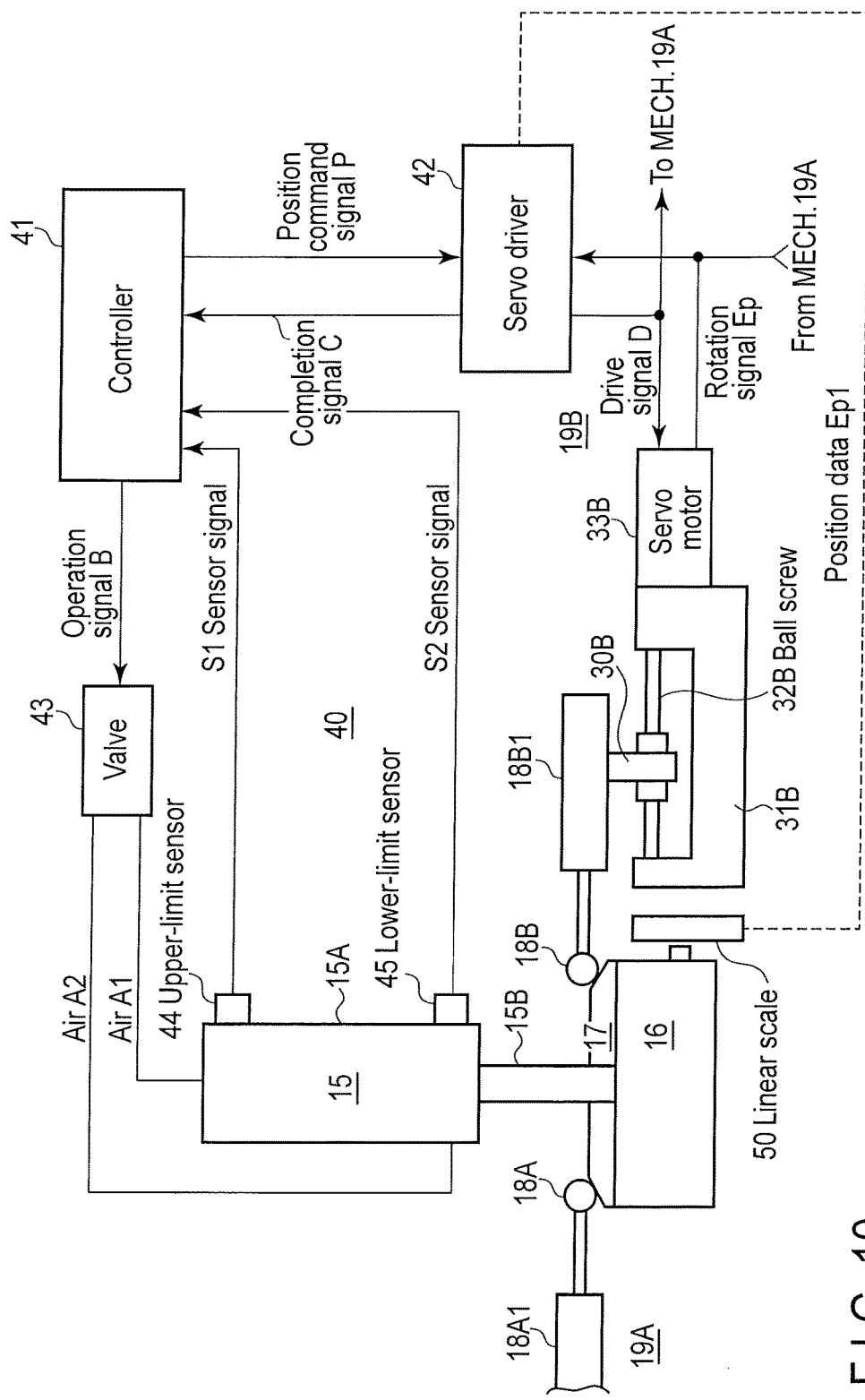
F I G. 10

CONTACT MODULE FOR ELECTRONIC COMPONENTS MEASUREMENT

CROSS-REFERENCE TO RELATED APPLICATIONS

This application is based upon and claims the benefit of priority from prior Japanese Patent Application No. 2014-095972, filed May 7, 2014, the entire contents of which are incorporated herein by reference.

BACKGROUND OF THE INVENTION

1. Field of the Invention

The present invention relates to a handling device for electronic components, and especially to a contact module used when measuring electrical characteristics of the electronic components.

2. Description of the Related Art

In general, performance, such as electrical characteristics, of manufactured electronic components (for example, IC devices), is checked when, for example, shipping. At this time, electronic components as measurement targets are sequentially taken out of respective positions in a manufactured product, using a handler, and are placed on a measurement socket in a measurement unit, where a predetermined electrical characteristic of the electronic components is measured. In this measurement, it is necessary to reliably bring the external terminal pins of each electronic component into contact with the measuring contact pins of the measurement socket. To this end, a pressing mechanism for pressing each electronic component against the measurement socket is used.

In accordance with recent multi-functionalization, the number of pins included in an external terminal is increased, and there is a tendency to increase the pressure applied to secure, during measurement, contact between the contact pins of the measurement socket and the terminal pins of each electronic component. In order to prevent deformation and/or damage of the terminal pins of the electronic components during the measurement due to the high pressure, a compression spring is contained in each contact pin of the measurement socket. In this structure, to simultaneously measure a large number of electronic components, a high pressure is required to compress the compression springs by a predetermined amount. At the same time, in order to press all electronic components by an appropriate pressure to thereby prevent damage of the precision electronic components, it is also necessary to precisely adjust the applied pressure. In the prior art, a vertical-shaft drive mechanism is used to simultaneously apply a vertically downward pressure to a plurality of electronic components placed on a plurality of measurement sockets horizontally arranged. Such a vertical-shaft drive mechanism more and more increases in weight and size in accordance with increases in the pressure needed for measurement. Accordingly, a control mechanism employed in the vertical-shaft drive mechanism to precisely apply a required, vertically downward, high pressure has become complex.

BRIEF DESCRIPTION OF THE SEVERAL VIEWS OF THE DRAWING

FIG. 10 is a block diagram showing a control system that uses a computer as a controller for controlling the operation of the measurement pressure mechanisms where the combination of the servo motor and ball screws are used as the translation guide mechanism.

DETAILED DESCRIPTION OF THE INVENTION

Figure 1:
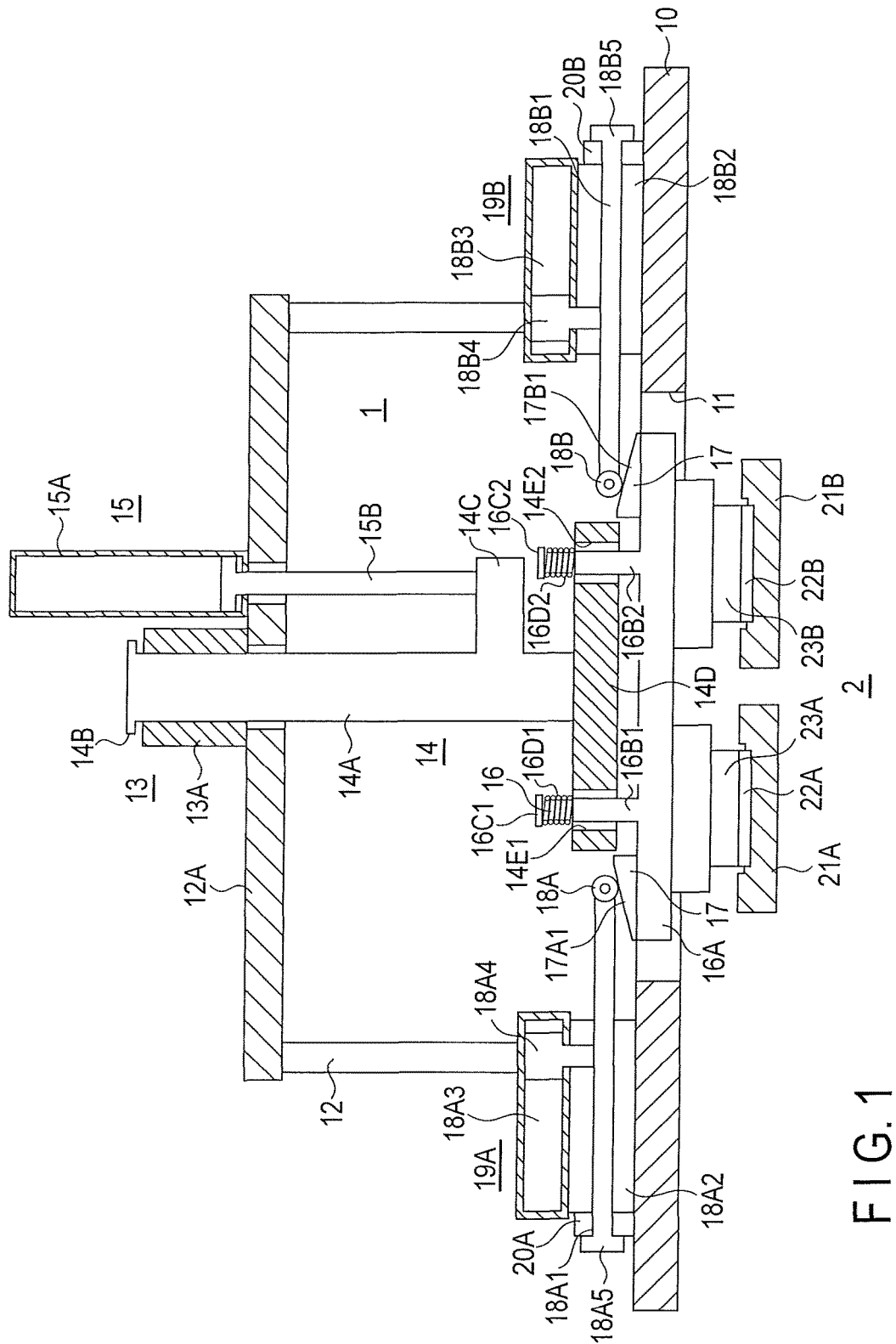
FIG. 1 is a schematic cross-sectional view showing the entire structure of a desktop contact module according to an embodiment of the invention.

An embodiment of the invention will be described in detail with reference to the accompanying drawings.

The embodiment of the invention provides a contact module used when measuring the electric characteristics of electronic components, such as IC devices, and includes a module configured as a portable desktop contact module as an example of the module. However, the portable desktop contact module is merely an embodiment, and it is a matter of course that a stationary contact module can be another embodiment.

An embodiment of the invention aims to provide a contact module that is designed in accordance with a large number of pins of electronic components, has a simple structure, and can accurately apply a necessary pressure to the components, thereby accurately measuring the electric characteristics of the components is achieved while preventing the components from damage, deformation, etc.

In accordance with an embodiment of the invention, there is provided a contact module for measuring an electronic component, comprising:

a main unit base;

a vertical-shaft support mechanism secured to the main unit base;

a vertical-shaft unit including at least one vertical shaft vertically movably supported by the vertical-shaft support mechanism, and a contact-unit support member formed integral with the vertical shaft;

a vertical-shaft drive mechanism configured to vertically move the vertical-shaft unit;

a contact unit including a pressure plate vertically movably hung under the contact-unit support member;

a cam block including at least one cam secured to the pressure plate; and a measurement pressure mechanism secured to the main unit base and including a cam follower engaged with the cam, and a cam-follower drive mechanism configured to horizontally move the cam follower within the cam, wherein the cam-follower drive mechanism is horizontally driven to lower the pressure plate, with the pressure plate positioned above the electronic component placed in a measurement socket of an electronic-component measurement apparatus, the electronic component being pressed against the measurement socket by the pressure plate when the pressure plate is lowered.

In accordance with another embodiment of the invention, there is provided a contact module wherein an extension of the vertical shaft is set to pass substantially a center portion of the pressure plate;

the pressure plate is hung by the vertical-shaft unit in two symmetrical hanging positions with respect to the central portion;

first and second cam blocks are secured to the pressure plate near the two hanging positions, respectively;

first and second cam-followers are provided with respect to first and second com-follower drive mechanisms; and the first and second cam followers are engaged with the first and second cam blocks, wherein the pressure plate is configured to simultaneously press a plurality of electronic components against respective measurement sockets.

In accordance with yet another embodiment of the invention, there is provided a portable desktop contact module wherein when the pressure plate is positioned above and near an electronic component placed in a measurement socket of an electronic-component measurement apparatus, the main unit base of a desktop contact module is configured to be put on the electronic-component measurement apparatus during measurement.

Each embodiment of the invention can provide a contact module that is designed in accordance with a large number of pins of electronic components, has a simple structure, and can accurately apply a necessary pressure to the components, thereby accurately measuring the electric characteristics of the components while preventing the components from damage, deformation, etc.

FIG. 1 shows the entire structure of a desktop contact module 1 according to the embodiment. This may be designed to be installed in a measurement apparatus called a tester for measuring the electric characteristics of electronic components.

In FIG. 1, a main unit base 10 incorporated in the desktop contact module 1 is a mount unit for mounting thereon measurement pressure mechanisms and a vertical-shaft support mechanism, described later, and components associated with them. The main unit base 10 is mounted and secured at a position on a tester for measuring the electric characteristics of the electronic components, which position corresponds to a measurement-socket positioning area.

The main unit base 10 has an opening 11 at a position corresponding to the measurement-socket positioning area for a measuring unit 2 incorporated in the tester, when the module 1 is secured on the tester. The opening 11 is provided for measurement, and a vertical-shaft support base 12 is secured to the base 10 near the periphery of the opening 11.

A horizontal top board 12A extending above the opening 11 formed in the main unit base 10, with a predetermined distance therefrom, is formed integral with the base. A vertical-shaft support mechanism 13 is provided on the horizontal top board 12A.

The vertical-shaft support mechanism 13 has a translation guide 13A for supporting a vertical-shaft unit 14 including a vertical shaft 14A perpendicularly extending through the top board 12A toward the opening 11. The guide 13A supports the unit 14 so that the unit 14 is vertically movable. A stopper 14B is formed on the upper end of the vertical shaft 14A. When the stopper 14A is engaged with the upper end of the translation guide 13A, lowering movement of the vertical shaft 14A is stopped.

A fixing part 14C for fixing the lower end of a piston 15B included in an air cylinder 15A is formed at a side surface of the vertical shaft 14A near the lower end thereof. The air cylinder 15A constitutes a vertical-shaft drive mechanism 15 for vertically driving the vertical shaft 14A. As another example of the vertical-shaft drive mechanism 15, a drive mechanism can be used, in which a ball screw, for example, is used instead of the piston 15B, and part of the ball screw is fixed to the fixing part 14C such that the ball screw is rotated by a servo motor to move the vertical shaft 14A vertically. This structure will be described later in detail with reference to FIGS. 8 and 9.

When electronic components are mounted on measurement sockets 21A and 21B shown in FIG. 1, described later, the vertical shaft 14A is moved upward by the vertical-shaft drive mechanism 15 toward the origin position, and is moved downward when the components are measured.

A hanging board 14D for hanging a contact unit 16, described later, is horizontally attached to the lower end of the vertical shaft 14A. Contact unit hanging holes 14E1 and 14E2 are formed in the hanging board 14D at opposite positions at substantially the same distance from the vertical shaft 14A.

The contact unit 16 comprises a pressure plate 16A used when pressing electronic components, and a pair of hanging arms 16B1 and 16B2 vertically extending from the upper surface of the pressure plate 16A. The hanging arms 16B1 and 16B2 extend through the hanging holes 14E1 and 14E2, respectively, and are hung from the hanging board 14D by stoppers 16C1 and 16C2 provided on the upper ends of the arms 16B1 and 16B2, respectively. The hanging arms 16B1 and 16B2 are formed longer by a predetermined amount than the thickness of the hanging board 14D, and thinner by a predetermined amount than the inner diameter of the hanging holes 14E1 and 14E2. Further, first and second compression springs 16D1, 16D2 are provided between the upper surface of the board 14D and the stoppers 16C1 and 16C2 on the upper ends of the handing arms 16B1 and 16B2, so that the contact unit 16 is hung below the vertical-shaft unit 14, with certain degrees of freedom corresponding to the predetermined amounts maintained horizontally and vertically, via the springs 16D1, 16D2. The function of the springs 16D1, 16D2 will be described later with reference to FIGS. 2 and 3.

By virtue of the above structure, the contact unit 16 is configured to vertically move within the opening 11 in the main unit base 10, along with the vertical shaft 14A, when the vertical shaft 14A is moved vertically.

A cam block 17 having a pair of cam slopes 17A1 and 17B1 is secured to the upper surface of an edge portion of the pressure plate 16A of the contact unit 16.

Cam followers 18A and 18B are engaged with the cam slopes 17A1 and 17B1 of the cam block 17, respectively. Cam follower drive mechanisms comprise the cam followers 18A and 18B rotatably attached to the tips of cam follower drive shafts 18A1 and 18B1, respectively, translation guide mechanisms 18A2 and 18B2 horizontally holding the cam follower drive shafts 18A1 and 18B1 via support members 18A11 and 18B11, respectively, and air cylinders 18A3 and 18B3 for driving pistons 18A4 and 18B4 coupled to the cam follower drive shafts 18A1 and 18B1 within the translation guide mechanisms 18A2 and 18B2, respectively. Stoppers 18A5 and 18B5 are provided at other ends of the cam follower drive shafts 18A1 and 18B1, respectively. The cam follower drive mechanisms constitute measurement pressure mechanisms 19A and 19B secured to the above-mentioned main unit base 10.

Further, when the air cylinder 18A3 and 18B3 are used for driving the cam follower drive shafts 18A1 and 18B1, contact-unit-height adjust mechanisms 20A and 20B are provided on the air cylinders 18A3 and 18B3, whereby the height of the contact unit 16 can be adjusted to be adapted to electronic components as measurement targets or the measurement sockets of the tester. These contact-unit-height adjustment mechanisms 20A and 20B are secured to the main unit base 10. Their detailed structures will be described later.

Figure 8:
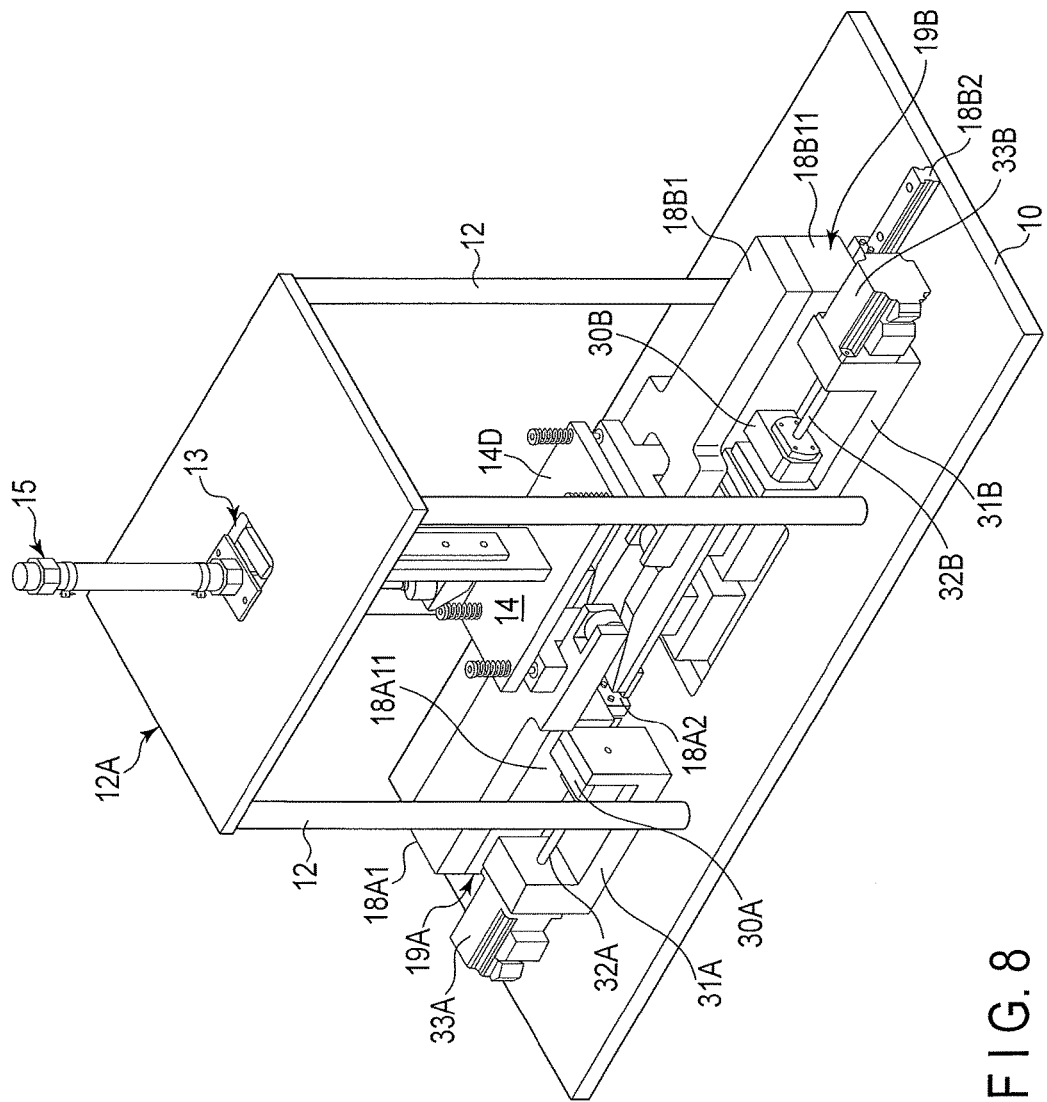
FIG. 8 is a perspective view showing an embodiment of the measurement pressure mechanisms, where a combination of a servo motor and ball screws are used as a translation guide mechanism.
Figure 9:
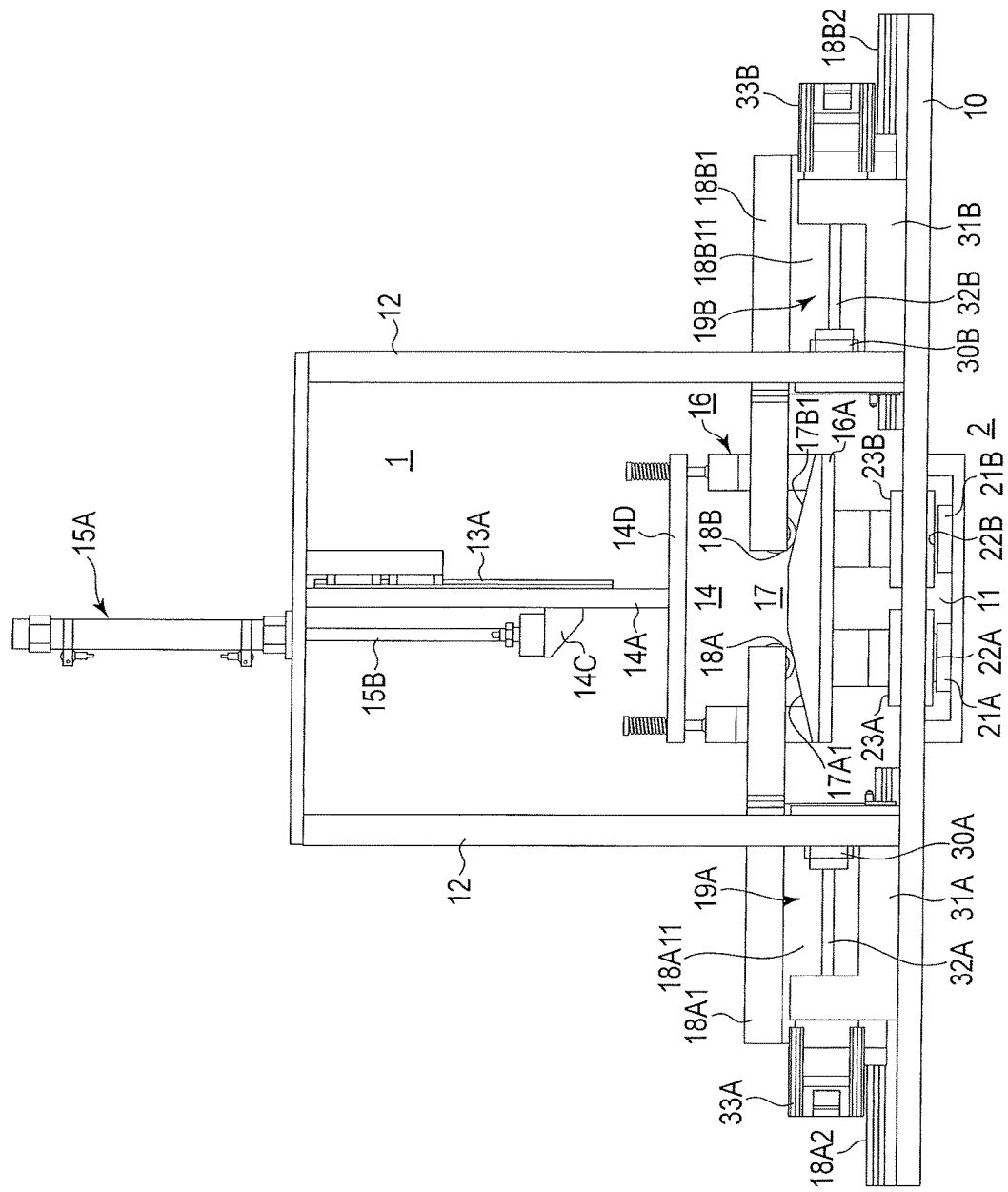
FIG. 9 is a side view showing a side of the module in the state of FIG. 8.

For driving of the cam follower drive shafts 18A1 and 18B1, a combination of servo motors and ball screws can be used instead of the air cylinders 18A3 and 18B3. FIGS. 8 and 9 show an embodiment directed to this structure. This embodiment is similar to the embodiment of FIG. 1 except for that the servo motors and the ball screws are used to drive the cam follower drive shafts 18A1 and 18B1. Therefore, no detailed description will be given of the overlapping components.

In FIGS. 8 and 9, a driving force transmission block 30A is secured to the support member 18A11 of the one cam follower drive shaft 18A1, and is engaged with a ball screw 32A rotatably supported by the ball-screw support block 31A fixed to the main unit base 10. The ball screw 32A is rotated by a servo motor 33A secured to the main unit base 10 outside the ball-screw support block 31A. Rotation of the servo motor 33A is transmitted to the ball screw 32A. In accordance with rotation of the ball screw 32A, the driving force transmission block 30A moves horizontally forward and backward along the ball screw 32A within the ball screw support block 31A, thereby transmitting these movements to the cam follower drive shaft 18A1 through the support member 18A11. As a result, the cam follower drive shaft 18A1 moves horizontally forward and backward along the translation guide mechanism 18A2.

Similarly, a driving force transmission block 30B is secured to the support member 18B11 of the cam follower drive shaft 18B1, and is engaged with a ball screw 32B rotatably supported by a ball-screw support block 31B secured to the main unit base 10. The ball screw 32B is rotated by a servo motor 33B secured to the main unit base 10 outside the ball-screw support block 31B. Rotation of the servo motor 33B is transmitted to the ball screw 32B. In accordance with rotation of the ball screw 32B, the driving force transmission block 30B moves horizontally forward and backward along the ball screw 32B within the ball screw support block 31B, thereby transmitting these movements to the cam follower drive shaft 18B1 through the support member 18B11. As a result, the cam follower drive shaft 18B1 moves horizontally forward and backward along the translation guide mechanism 18B2.

Returning to FIG. 1, electronic components 22A and 22B are placed, during measurement, on a plurality (only two are shown) of measurement sockets 21A and 21B, respectively, of the tester for measuring the electric characteristics of the electronic components, and jig parts 23A and 23B are placed on the electronic components 22A and 22B, respectively. The jig parts 23A and 23B are measurement auxiliary parts prepared in accordance with the form or type of each electronic component as a measurement target, and are exchanged for other ones in accordance with the types of the electronic components. The jig parts have a function of, for example, setting electronic components to a predetermined temperature. The predetermined temperature includes a low temperature of, for example, 0° C., or a high temperature of, for example, 80° C.

In this state, the vertical-shaft drive mechanism is lowered to bring the contact unit 16 into contact with the jig parts 23A and 23B, and then the measurement pressure mechanisms 19A and 19B are driven to advance the cam followers 18A and 18B along the cam slopes 17A1 and 17B1, respectively. As a result, the contact unit 16 presses the electronic components 22A and 22B with a predetermined force against the measurement sockets 21A and 21B via the jig parts 23A and 23B, respectively. The pressing force at this time is proportional to the travel distance of each of the cam follower drive shafts 18A1 and 18B1 advanced by the measurement pressure mechanisms 19A and 19B. Therefore, if the travel distances of the cam follower drive shafts 18A1 and 18B1 are accurately controlled by the air cylinders 18A3 and 18B3, the pressing force of the contact unit 16 can be controlled accurately.

When the cam follower drive shafts 18A1 and 18B1 are driven by the servo motors 33A and 33B shown in FIGS. 8 and 9, the travel distances of the cam follower drive shafts 18A1 and 18B1 can be controlled in accordance with the rotational speed of the servo motors 33A and 33B, as will be described later with reference to FIG. 10. Therefore, the pressing force of the contact unit 16 can be controlled more accurately.

Referring then to FIGS. 1 to 7, the structure, operation and function of the first embodiment of the invention will be described in detail.

Figure 2:
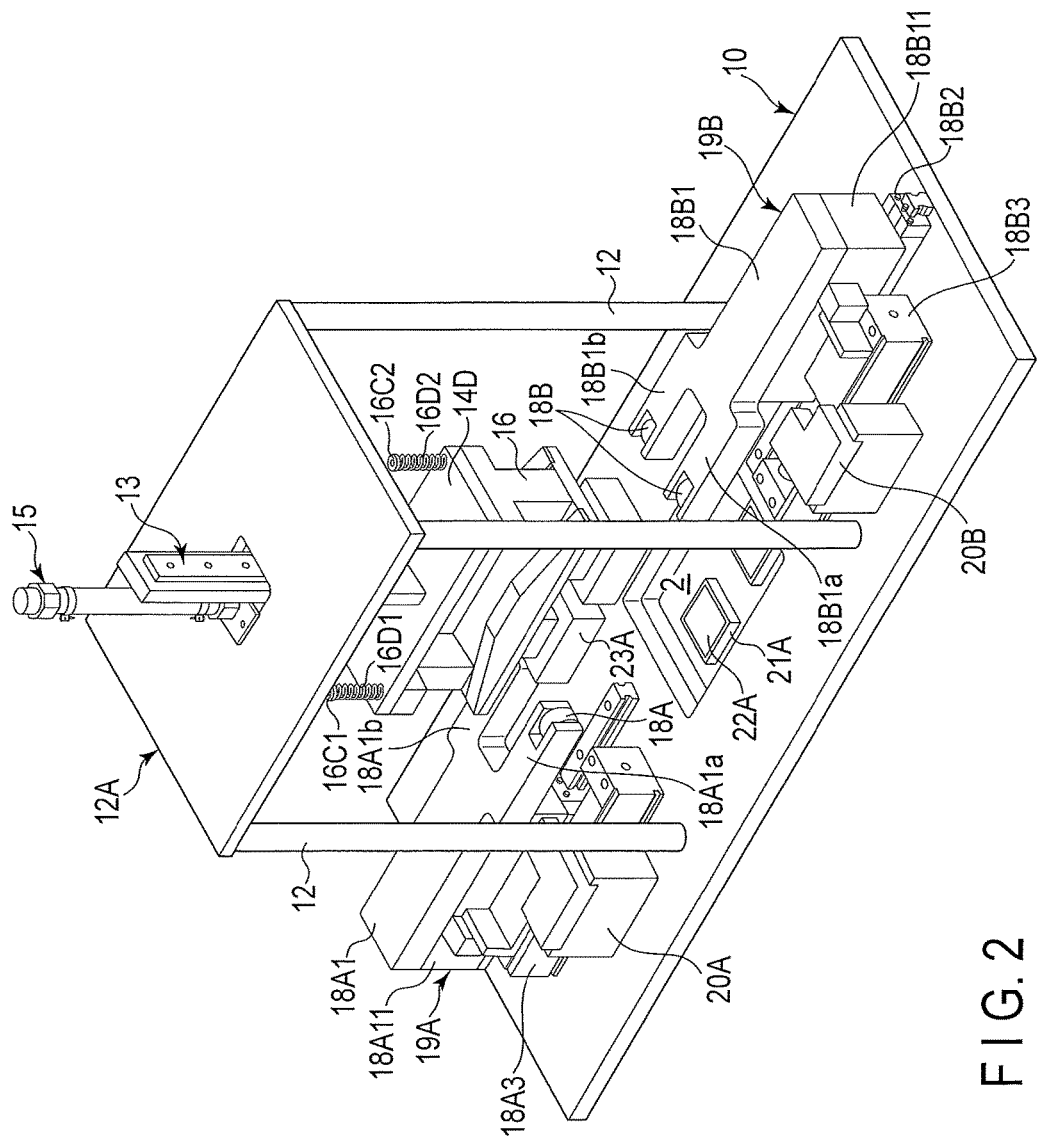
FIG. 2 is a perspective view showing a state where the vertical-shaft unit of the module shown in FIG. 1 is at an uppermost position (origin position)
Figure 3:
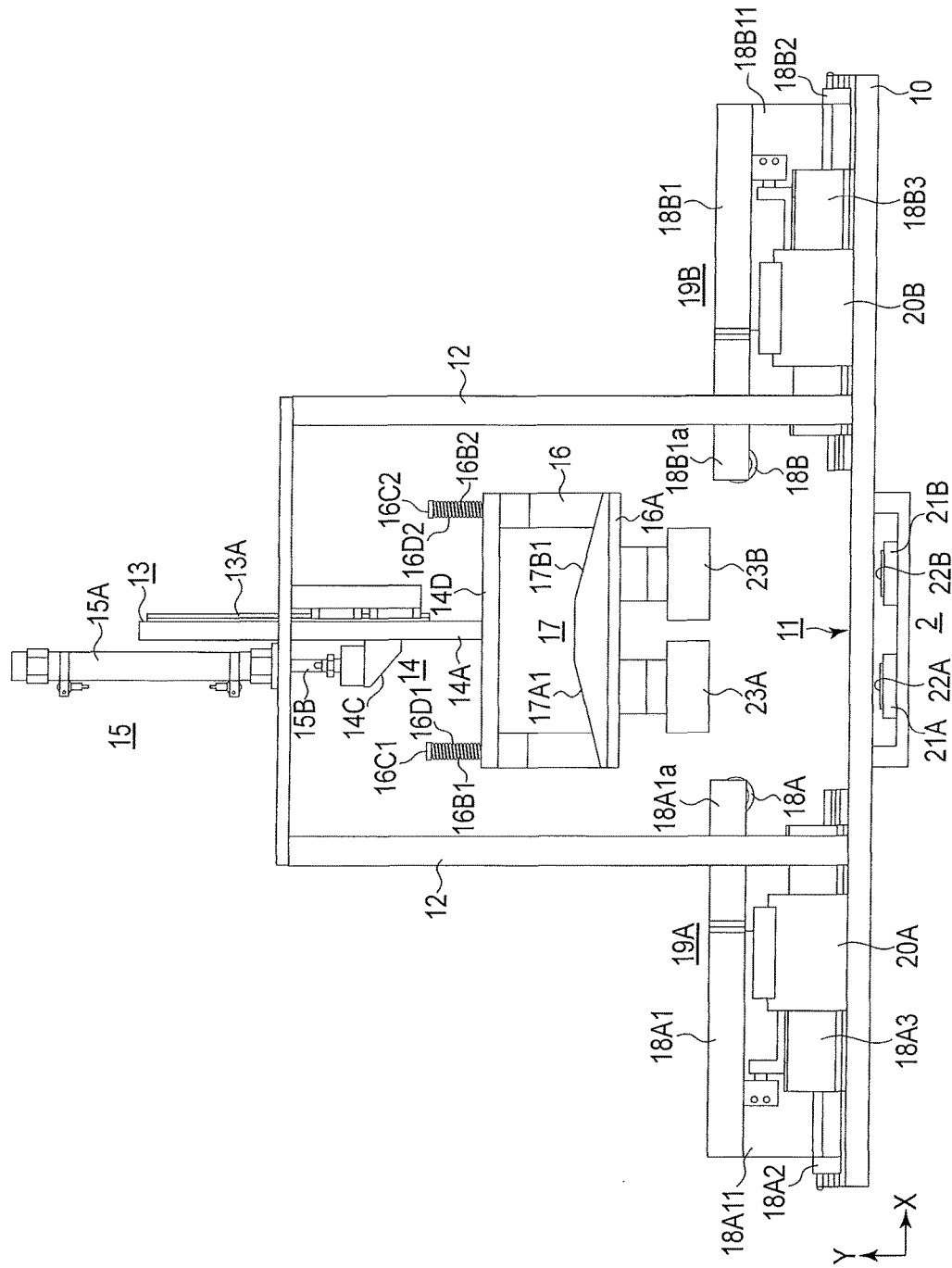
FIG. 3 is a side view showing a side of the module in the state of FIG. 2.

FIG. 2 is a perspective view showing a state where the desktop contact module 1 shown in FIG. 1 is at a measurement position, and the contact unit 16 is at an original position assumed before the start of measurement. FIG. 3 is a side view of the module 1 shown in FIG. 2.

In FIGS. 2 and 3, before the start of measurement, the electronic components 22A and 22B as measurement targets are transferred from a predetermined accumulation place onto the measurement sockets 21A and 21B provided in the measuring unit 2 of the tester, using a well known electronic-component handler (not shown). In this state, the desktop contact module 1 is positioned at the measurement position above the tester, and the contact unit 16 is positioned at the original position immediately above the measurement sockets 21A and 21B in the measuring unit 2, assumed before the start of measurement.

At the original position, the measurement pressure mechanisms 19A and 19B are driven to exhaust air from the air cylinders 18A3 and 18B3, thereby moving the air pistons 18A4 and 18B4 away from each other from their measurement positions, and retreating to their original positions, the cam follower drive shaft 18A1 and 18B1 connected to the air pistons 18A4 and 18B4, respectively, at the original position. At the original position, the cam followers 18A and 18B provided at the tips of the cam follower drive shafts 18A1 and 18B1 are disengaged from the cam slopes 18A1 and 18B1, respectively. Although FIG. 1 shows one cam follower 18A (or 18B) attached to the cam follower drive shaft 18A1 (or 18B1), each of the cam follower drive shafts 18A1 and 18B1 is actually branched into two as shown in FIG. 2. Rollers constituting a pair of cam followers 18A are rotatably attached to the respective tips of the branch portions 18A1*a* and 18A1*b* of one cam follower drive shaft 18A1. Similarly, rollers constituting a pair of cam followers 18B are rotatably attached to the respective tips of the branch portions 18B1*a* and 18B1*b* of the other cam follower drive shaft 18B1.

In this state, the vertical-shaft drive mechanism is driven to raise the air piston 15B in the air cylinder 15A. FIG. 3 shows a state where the air piston 15B is set at its uppermost position. In accordance with the raise of the air piston 15B, the vertical shaft 14A of the vertical-shaft unit 14 is pulled up along the guide 13A of the vertical-shaft support mechanism 13. As a result, the pressure plate 16A hung, via a pair of hanging arms 16B1 and 16B2, by the hanging board 14D attached to the lower end of the vertical shaft 14A is also pulled up. A pair of hanging arms 16B1 and 16B2 vertically extend from the upper side surface of the pressure plate 16A through the handing holes 14E1 and 14E2 formed in the hanging board 14D, thereby protruding their upper ends above the hanging board 14D. Respective compression springs 16D1, 16D2 are provided between the upper surface of the board 14D and the stoppers 16C1 and 16C2 on the upper ends of the handing arms 16B1 and 16B2. The compression springs 16D1, 16D2 always urge the pressure plate 16A against the hanging board 14D, thereby stabilizing the attitude of the pressure plate 16A, and also permitting the pressure plate 16A to move vertically. The hanging arms 16B1 and 16B2 are formed to have a length greater by a predetermined amount than the thickness of the hanging board 14D, and to have a diameter smaller by a predetermined amount than the inner diameter of the hanging holes 14E1 and 14E2. This enables the pressure plate 16A, i.e., the contact unit 16, to be hung below the vertical-shaft unit 14, with horizontal and vertical degrees of freedom corresponding to the above-mentioned predetermined amounts.

Thus, the contact unit 16 is configured to move upward above the opening 11 of the main unit base 10, along with the vertical shaft 14A, when the vertical shaft 14A is moved upward.

Figure 4:
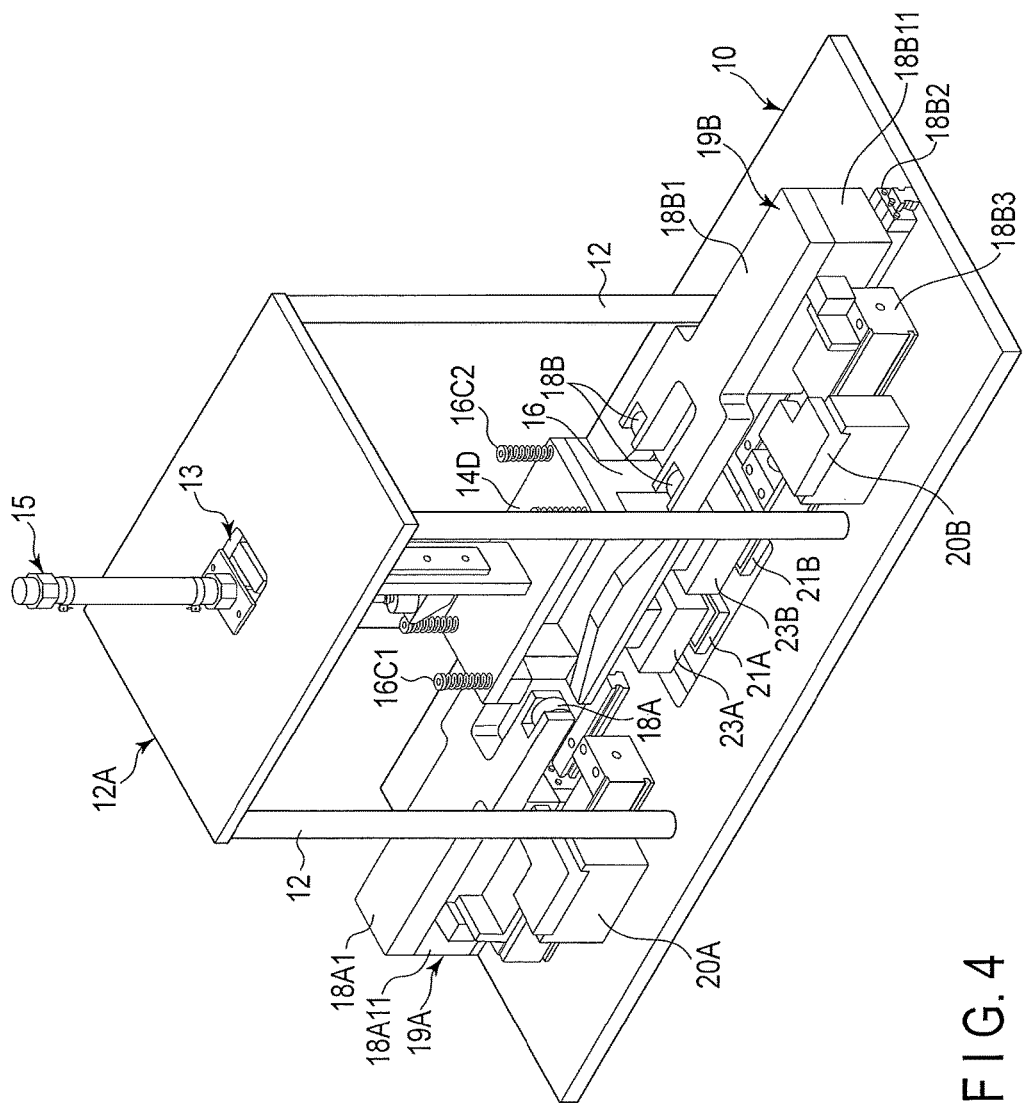
FIG. 4 is a perspective view showing a state where the vertical-shaft unit of the module shown in FIG. 1 is lowered to a predetermined position.
Figure 5:
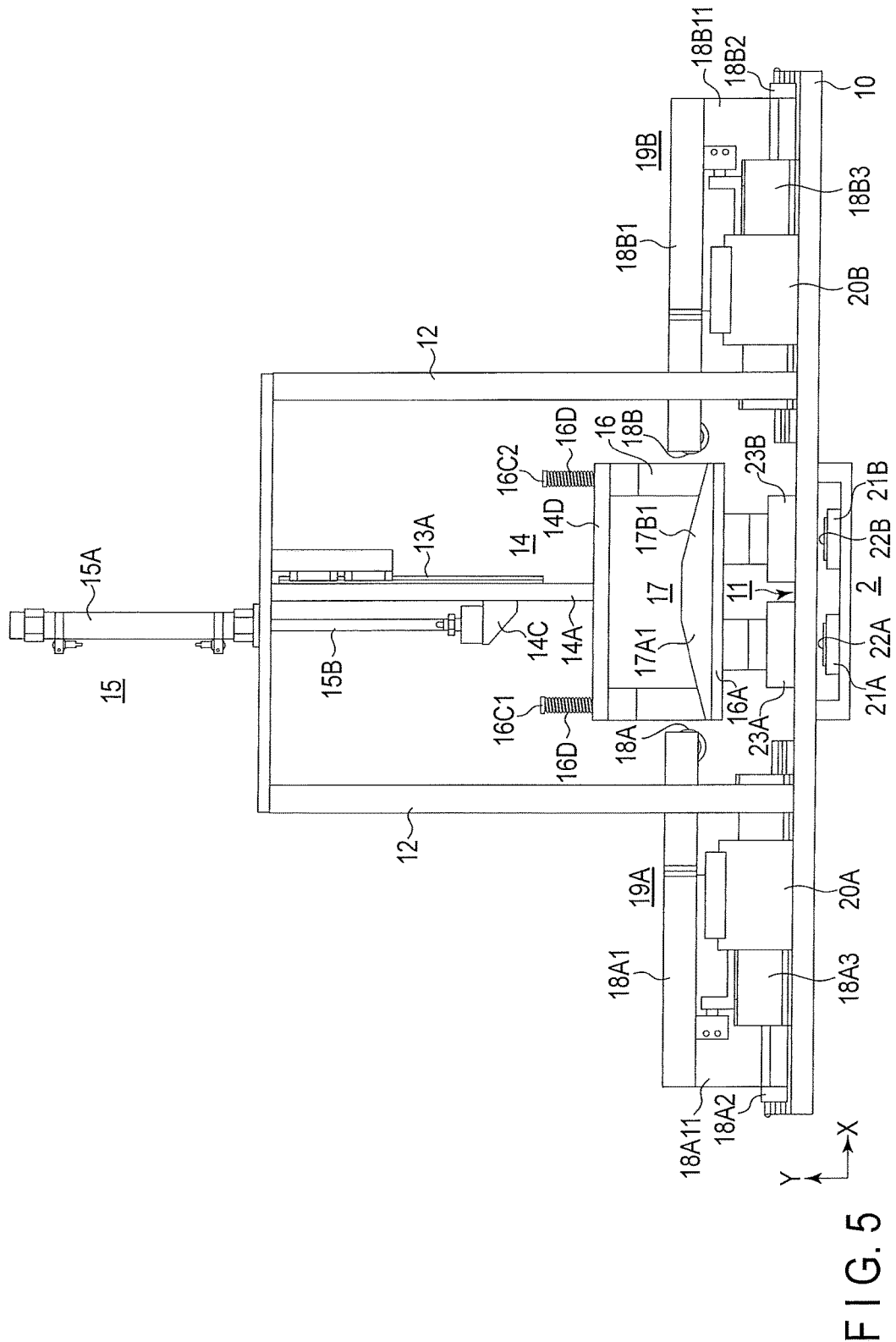
FIG. 5 is a side view showing a side of the module in the state of FIG. 4.

When measuring the electronic components 22A and 22B, the vertical-shaft drive mechanism 15 is driven with the electronic components 22A, 22B placed on the measurement sockets 21A and 21B, thereby injecting air into the air cylinder 15A to press the air piston 15B downward and hence lower the vertical-shaft unit 14, as is shown in FIG. 3. The operation of the mechanism 15 is controlled by the controller 41 as will be described by referring to FIG. 10. Downward driving of the air piston 15B is stopped at a position where the lower ends of the jig parts 23A and 23B attached to the lower surface of the contact unit 16 slightly enters the opening 11 of the main unit base 10. This state is shown in FIGS. 4 and 5. As the air piston 15B lowers, the vertical shaft 14A of the vertical-shaft unit 14 lowers along the guide 13A of the vertical-shaft support mechanism 13. As a result, the pressure plate 16A hung, via the hanging arms 16B1 and 16B2, by the hanging board 14D attached to the lower end of the vertical shaft 14A also lowers.

As shown in FIG. 5, where the lower ends of the jig parts 23A and 23B attached to the lower surface of the contact unit 16 slightly enters the opening 11 of the main unit base 10, the vertical-shaft drive mechanism 15 is stopped. In this state, the lower ends of the cam slopes 17A1 and 17B1 close to the cam followers 18A and 18B are stopped at positions slightly lower than the lower ends of the cam followers 18A and 18B. FIG. 5 clearly shows this state.

Figure 6:
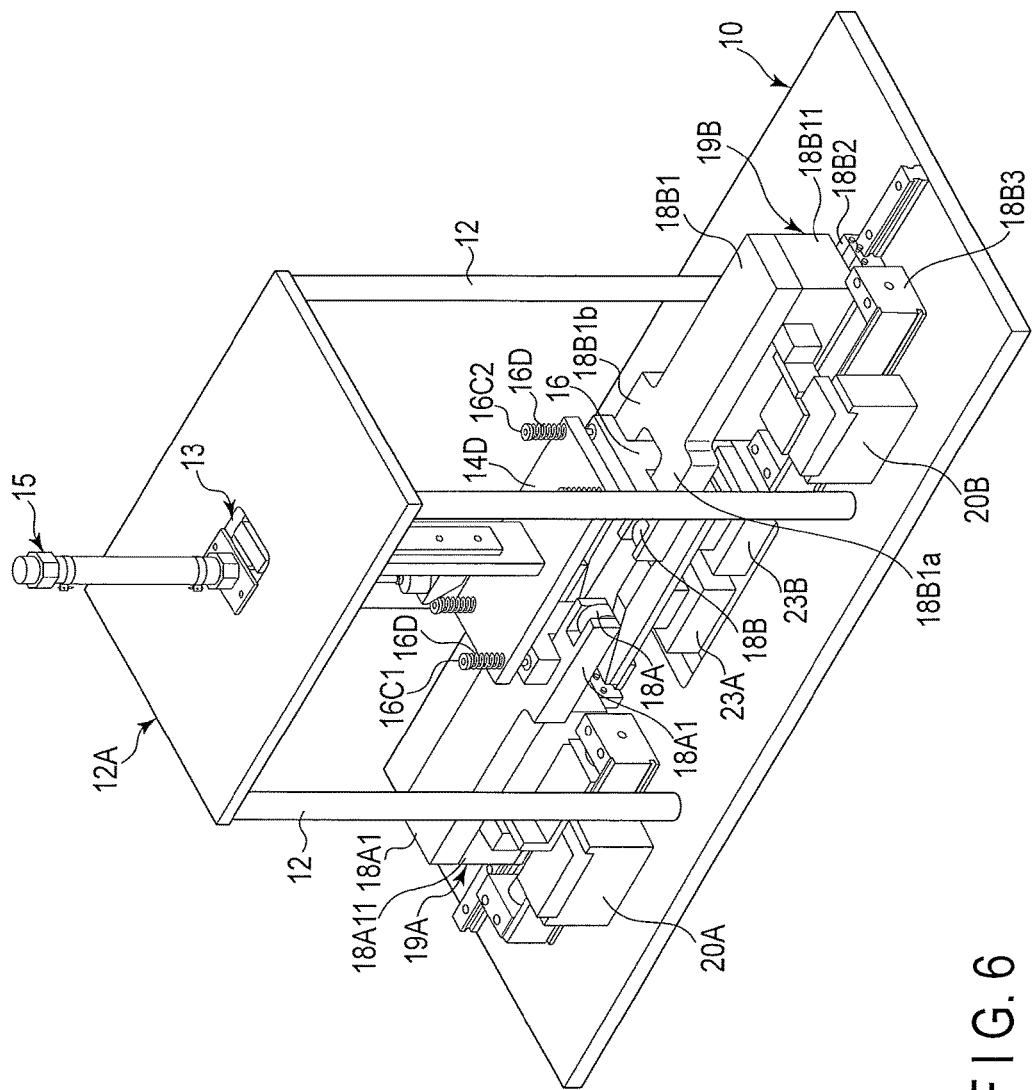
FIG. 6 is a perspective view showing a state where the contact unit of the module shown in FIG. 1 is lowered to an electronic-component measurement pressure position by measurement pressure mechanisms.
Figure 7:
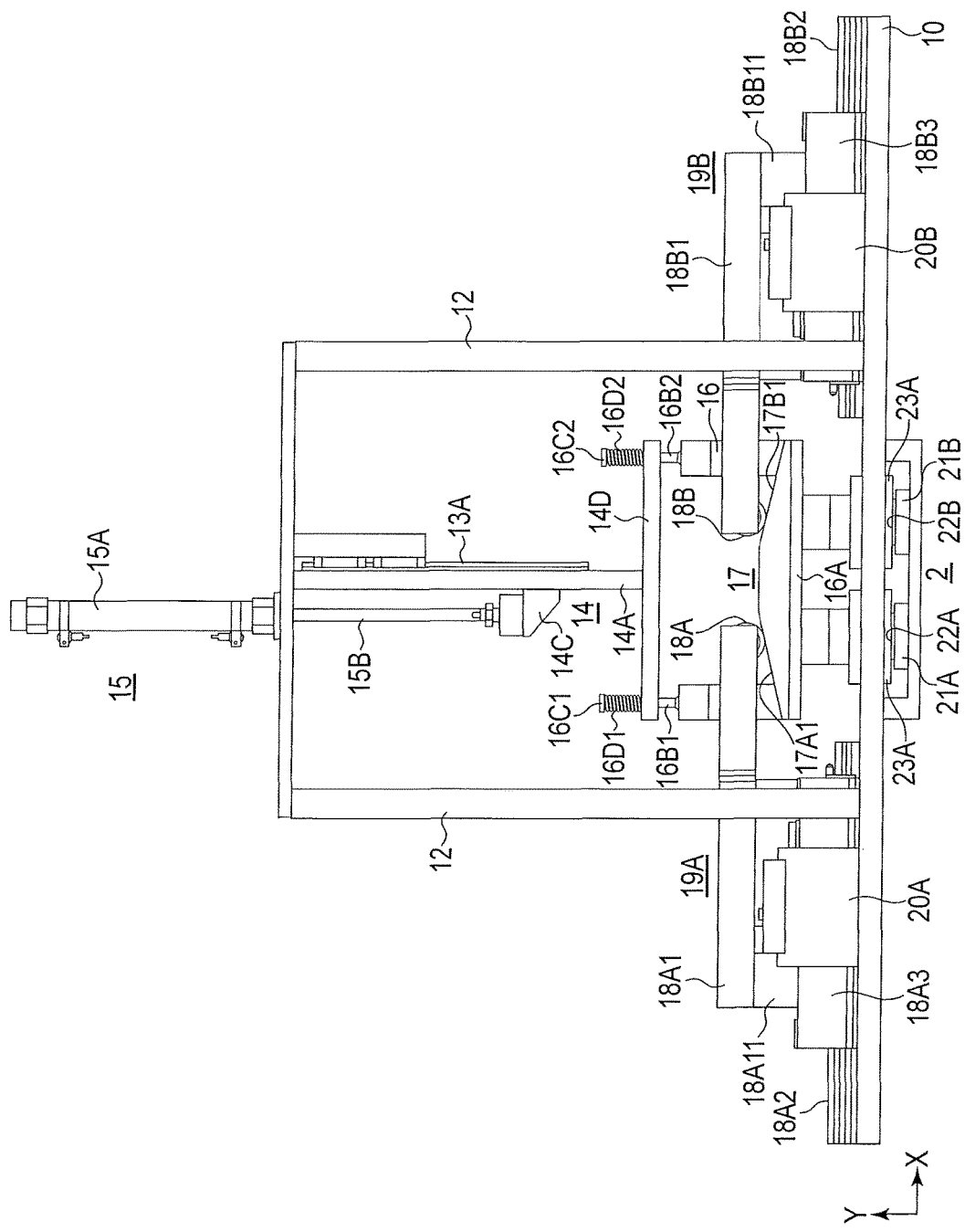
FIG. 7 is a side view showing a side of the module in the state of FIG. 6.

Referring then to FIGS. 6 and 7, a description will be given of a pressing operation of the electronic components 22A and 22B by the measurement pressure mechanisms 19A and 19B.

When lowering of the vertical-shaft unit 14 by the vertical-shaft drive mechanism 15 is stopped at the position shown in FIG. 5, air is injected into the air cylinders 18A3 and 18B3 of the measurement pressure mechanisms 19A and 19B. As a result, the cam follower drive shafts 18A1 and 18B1 connected to the air pistons 18A4 and 18B4 shown in FIG. 1 move forward. This causes the rollers constituting the pair of cam followers 18A and 18B attached to the tips of the branch portions 18A1*a*, 18A1*b*, 18B1*a* and 18B1*b* to be engaged with the cam slopes 17A1 and 17B1 and to be advanced along the cam slopes 17A1 and 17B1.

Since the cam follower drive shafts 18A1 and 18B1 are restricted to advance and retreat only horizontally on the main unit base 10 by the translation guide mechanisms 18A2 and 18B2, the cam blocks 17A and 17B are pushed down and hence the pressure plate 16A of the contact unit 16 is also pushed down, as the cam followers 18A and 18B advance along with the cam slopes 17A1 and 17B1. Further, since the contact unit 16 is hung by the board 14D via the compression springs 16D1, 16D2 and the two pairs of hanging arms 16B1 and 16B2, the pressure plate 16A is pressed down against the spring forces of the compression springs 16D1, 16D2 while compressing them, when the cam blocks 17A and 17B are pushed down. At this time, the hanging board 14D is kept at the position shown in FIG. 5.

The lowering of the pressure plate 16A causes the pressure plate 16A to press the electronic components 22A and 22B with a predetermined force against the measurement sockets 21A and 21B via the jig parts 23A and 23B. This state is shown in FIG. 7. The pressing force at this time is proportional to the travel distances of the cam follower drive shafts 18A1 and 18B1 advanced by the measurement pressure mechanisms 19A and 19B, respectively. Therefore, if the advanced distances of the cam follower drive shafts 18A1 and 18B1 are accurately controlled by the air cylinders 18A3 and 18B3, the pressing force of the contact unit 16 can be controlled accurately.

In this state, electrical characteristics at a given temperature of the electronic components 22A and 22B placed on the measurement sockets 21A and 21B are measured. At this time, the jig parts 23A and 23B are maintained at a predetermined temperature for setup of a measurement temperature. Thus, by bringing the jig parts 23A and 23B into contact with the electronic components 22A and 22B, the predetermined temperature is transferred for measurement to the electronic components 22A and 22B.

In the above embodiment, the measurement pressure mechanisms 19A and 19B are formed using air cylinders. Referring now to FIGS. 8 to 10, a description of a pressurization operation performed on the electronic components 22A and 22B in another embodiment will be given during measurement by the measurement pressure mechanisms 19A and 19B.

Referring to FIG. 9, the electronic components 22A and 22B as measurement targets are transferred from a predetermined accumulation place onto the measurement sockets 21A and 21B provided in the measuring unit 2 of the tester, using an electronic-component handler (not shown), in a similar manner as in the case of FIGS. 2 and 3. In this state, the desktop contact module 1 is positioned at the measurement position above the tester, and the contact unit 16 is positioned at the original position immediately above the measurement sockets 21A and 21B in the measuring unit 2, assumed before the start of measurement.

At this original position, a position command signal P is sent, to a servo driver 42, from a controller formed of, for example, a computer, within a control system 40 shown in FIG. 10, whereby the servo motor 33B of the measurement pressure mechanism 19B is driven by a drive signal D sent from the servo driver 42. In the same way, the measurement pressure mechanism 19A is simultaneously driven by the drive signal D sent from the servo driver 42. To simplify the description, only the operation of the measurement pressure mechanism 19B will be described.

At first, the servo motor 33B is driven, the ball screw 32B rotates in reverse, and the cam follower drive shaft 18B1 moves away from the measurement position. The servo motor 33B additionally comprises an encoder therein (not shown) for outputting a rotation or position signal Ep corresponding to the rotation position of the servo motor 33B. The position signal Ep is transmitted from the encoder to the servo driver 42. The servo driver 42 compares the position signal Ep with the position command signal P from the controller 41, and stops the servo motor 33B when the position signal Ep and the position command signal P coincide with each other. At this time, an operation completion signal C is sent from the servo driver 42 to the controller 41. This means that the controller 41 is informed of that the cam follower drive shaft 18B1 has been retreated to the original position. At the same time, the cam follower drive shaft 18A1 of the measurement pressure mechanism 19A also retreats to the original position. At the original position, the engagement of the cam followers 18A and 18B provided at the tips of the cam follower drive shafts 18A1 and 18B1, with the cam slopes 17A1 and 17B1 is released in the similar manner as shown in FIG. 5.

The state shown in FIG. 9, in which the cam followers 18A and 18B are engaged with the cam slopes 17A1 and 17B1, respectively, corresponds to a pressurization start state described later.

In the engagement-released state shown in FIG. 5, the controller 41 having received the completion signal C outputs an operation signal B to a bulb 43, and the air piston 15B of the vertical-shaft drive mechanism 15 is upward driven by air A2 supplied by the bulb 43. When the air piston 15B reaches the uppermost end of its operation range, it drives an upper-limit sensor 44, whereby the sensor 44 sends a sensor signal S1 to the controller 41. At this time, the controller 41 sends the operation signal B to the bulb 43 to stop the air piston 15B at the uppermost end, as is shown in FIG. 3.

Where the air piston 15B is at the uppermost end, the pressure plate 16A hung by the hanging board 14D attached to the lower end of the vertical shaft 14A is also raised as described in the first embodiment. As a result, the contact unit 16 is raised above the opening 11 formed in the main unit base 10, along with the vertical shaft 14A.

When the measurement of the electronic components 22A and 22B is performed, the bulb 43 is driven by the controller 41 to thereby inject air A1 into the air cylinder 15A of the vertical-shaft drive mechanism 15, whereby the air piston 15B is pushed down to lower the vertical-shaft unit 14, in the same way as described with reference to FIG. 3. The downward driving of the air piston 15B is stopped when a lower-limit sensor 45 is driven to output a sensor signal S2 to the controller 41. In this state, the jig parts 23A, 23B is stopped at a position where the lower ends of the jig parts 23A and 23B attached to the lower surface of the contact unit 16 is placed to slightly enter the opening 11 formed in the main unit base 10, as is shown in FIGS. 4 and 5.

As in the case shown in FIG. 5, the driving of the vertical-shaft drive mechanism 15 by the controller 41 is stopped at the position where the lower ends of the jig parts 23A and 23B attached to the lower surface of the contact unit 16 slightly enter the opening 11 formed in the main unit base 10. In this state, the lower ends of the cam slopes 17A1 and 17B1 close to the cam followers 18A and 18B stop at a position slightly lower than the lower ends of the cam followers 18A and 18B, as is shown in FIG. 5.

Referring then to FIGS. 8 and 9, a pressurization operation of the measurement pressure mechanisms 19A and 19B performed during measurement on the electronic components 22A and 22B will be described.

Where the engagement of the cam followers 18A and 18B, provided at the tips of the cam follower drive shafts 18A1 and 18B1, with the cam slopes 17A1 and 17B1 is released as shown in FIG. 5, the servo driver 42 is driven by the position command signal, the servo motors 33A and 33B are rotated forward by the drive signal D from the servo driver 42. As a result, the ball screws 32A and 32B are rotated forward, and hence the cam follower drive shafts 18A1 and 18B1 coupled to the driving force transfer blocks 30A and 30B via the support components 18A11 and 18B11 are advanced toward each other. This causes the cam followers 18A and 18B to be engaged with and advanced along with the cam slope 17A1 and 17B1, respectively, as is shown in FIGS. 8 and 9.

As the cam followers 18A and 18B advance along with the cam slopes 17A1 and 17B1, the cam block 17 is pushed downward, whereby the pressure plate 16A of the contact unit 16 is also pushed downward.

In accordance with the lowering of the pressure plate 16A provided in the contact unit 16, the electronic components 22A and 22B are pressed with a predetermined force against the measurement sockets 21A and 21B by the pressure plate 16A via the jig parts 23A and 23B, as is shown in FIG. 9. The pressing force at this time is proportional to the travel distances of the cam follower drive shafts 18A1 and 18B1 advanced by the measurement pressure mechanisms 19A and 19B, respectively. Therefore, if the travel distances of the cam follower drive shafts 18A1 and 18B1 are monitored by enabling the servo driver 42 to compare the rotation or position signals Ep of the encoders of the servo motors 33A and 33B with the position command signal P from the controller 41, the pushing force of the contact unit 16 can be controlled accurately.

Instead of using position data of the cam follower drive shafts 18A1 and 18B1 represented by rotation signals from the encoders of the servo motors, feedback control may be executed wherein position data Ep1 produced by the linear scale 50 indicating the vertical movement of the contact unit 16 provided near the contact unit 16 is supplied to the servo motor 42 and is compared therein with the position command signal P, as shown in FIG. 10. In this case, more accurate position control is possible than the case where the rotation signals Ep from the encoders are used as position data. In this state, the electronic components 22A and 22B placed on the measurement sockets 21A and 21B are measured.

Figure 11:
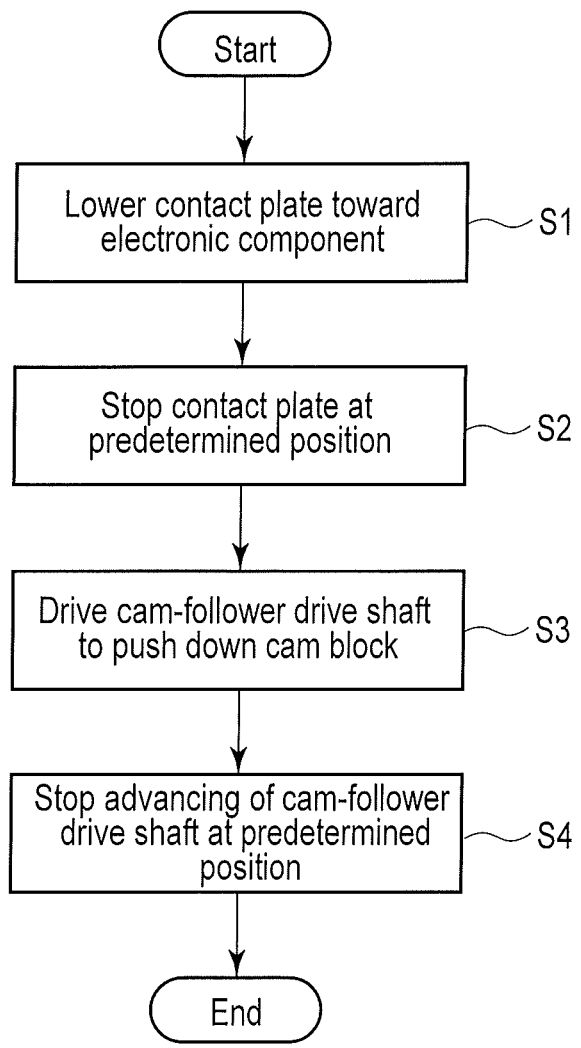
FIG. 11 is a flowchart for explaining a method of controlling the measurement pressure mechanisms by the control system using the computer shown in FIG. 10.

FIG. 11 is a flowchart showing a method of driving the contact module 1 according to the embodiment shown in FIGS. 8 to 10, using the control system 40 shown in FIG. 10. In FIG. 11, the contact module 1 is controlled to be positioned at the original (start) position shown in FIGS. 2 and 3, based on the position command signal P output from the computer constituting the controller 41.

In first step S1, the bulb 43 is driven by the operation signal B from the controller 41, thereby driving the vertical-shaft drive mechanism 15 above the measurement positions of the electronic components 22A and 22B to perpendicularly lower the pressure plate 16A toward the electronic components 22A and 22B placed on the measurement sockets 21A and 21B of the electronic-component measuring unit 2, in order to press the electronic components against the sockets.

In subsequent step S2, when the pressure plate 16A (contact plate) is positioned at a predetermined position immediately above the electronic components 22A and 22B, the mechanism 15 is driven such that the lower surfaces of the jig parts 23A and 23B attached to the pressure plate 16A approach the surfaces of the electronic components 22A and 22B, and the bulb 43 is controlled by the operation signal B to stop the driving of the vertical-shaft drive mechanism 15 to thereby stop the lowering of the pressure plate 16A. At this time, the pressure plate 16A stops at a position where the cam followers 18A and 18B attached to the tips of the cam follower drive shafts 18A1 and 18B1 are positioned slightly above the lower ends of the cam slopes 17A1 and 17B1 of the cam block 17 as described above.

In subsequent step S3, the servo driver 42 is driven by the position command signal P sent from the controller 41, thereby driving the servo motor 33B to horizontally move the cam follower drive shaft 18A1 and 18B1, with the cam followers 18A and 18B engaged with the cam slopes 17A1 and 17B1 of the cam block 17 provided on the pressure plate 16A. As a result, the cam block 17 is pushed down.

In subsequent step S4, the pressure plate 16A presses, using the cam block 17, the electronic components 21A and 21B via the jigs 23A, 23B with a predetermined pressure against the measurement sockets 22A and 22B, then forward rotation of the ball screw 32B of the servo motor 33B is stopped to stop horizontal advancing of the cam follower drive shaft 18A1 and 18B1.

In this state, the electronic-component measuring unit 2 is driven to measure the predetermined electric characteristics of the electronic components 21A and 21B at a given condition.

The above-described embodiment is directed to the case of measuring two electronic components. However, the embodiment may be modified as a contact module that has a structure wherein an extension of the vertical shaft 14A passes through substantially the center of the pressure plate 16A, the pressure plate 16A is hung by the hanging board 14D of the vertical-shaft unit 14 at two hanging positions symmetrical about the center of the plate 16A, the cam block 17 having a pair of cam slopes 17A1 and 17B1 is secured to an edge portion of the pressure plate 16A near the two hanging positions, and the cam followers 18A and 18B of the first and second cam follower drive shafts 18A1 and 18B1 are engaged with the first and second cam slopes, respectively. In this structure, two or more electronic components are simultaneously pressurized within the measurement sockets 21A and 21B by the pressure plate 16A.

Although in the embodiment, the cam followers of the first and second cam follower drive shafts are engaged with the first and second cam slopes, respectively, only one cam slope and only one cam follower engaged therewith may be employed. Yet alternatively, a large number of cam blocks may be employed to simultaneously measure a large number of electronic components.

As another embodiment of the invention, a portable desktop contact module can also be constructed. In this case, the main unit base of the contact module is configured to be secured on the electronic-component measuring device during measurement, with the pressure plate positioned above and near an electronic component placed on a measurement socket of the electronic-component measuring device.

Each embodiment of the invention can provide a contact module that is designed in accordance with a large number of pins of electronic components, has a simple structure and can accurately apply a necessary pressure to the components, thereby accurately measuring the electric characteristics of the components while preventing the components from damage, deformation, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiment described herein may be made without departing from the spirit of the invention. Even when a structural element is separately expressed in claims, or a plurality of elements are combined in claims, or a separated element and combined elements are combined in claims, they are all within the scope of the present invention. Further, even when claim is directed to a method, a step, or a program, the apparatus of the present invention is applied to the claim. The accompanying claims and their equivalents are intended to cover such forms or modifications as would fall within the scope and spirit of the inventions.

What is claimed is:

1. A contact module for measuring an electronic component, comprising:
   a main unit base;
   a vertical-shaft support mechanism secured to the main unit base;
   a vertical-shaft unit including at least one vertical shaft vertically movably supported by the vertical-shaft support mechanism, and a contact-unit support member formed integral with the vertical shaft;
   a vertical-shaft drive mechanism configured to vertically move the vertical-shaft unit;
   a vertically movable pressure plate hung under the contact-unit support member;
   a cam block including at least one cam provided on the pressure plate; and
   a measurement pressure mechanism secured to the main unit base and including a cam follower engaged with the cam, and a cam-follower drive mechanism configured to horizontally move the cam follower on the cam,
   wherein the cam-follower drive mechanism moves the cam follower on the cam to lower the pressure plate, with the pressure plate being positioned above the electronic component that is placed in a measurement socket of an electronic-component measurement apparatus, the electronic component being pressed against the measurement socket by the pressure plate when the pressure plate is lowered.

2. The contact module of claim 1, wherein the cam-follower drive mechanism includes a stopper configured to stop advancement of the cam-follower drive mechanism when the electronic component is pressed against the measurement socket with a predetermined pressure by the pressure plate.

3. The contact module of claim 1, wherein the contact-unit support member includes a hanging board for hanging the pressure plate, and a spring for urging the pressure plate against the hanging board.

4. The contact module of claim 3, wherein
the cam-follower drive mechanism of the measurement pressure mechanism includes an air cylinder, an air piston coupled to the air cylinder, a cam-follower drive shaft coupled to the air piston, and a translation guide mechanism configured to horizontally guide the cam-follower drive shaft; and
when driven to push down the pressure plate via the cam block, the measurement pressure mechanism pushes down the pressure plate against a tensile force of the spring mechanism.

5. The contact module of claim 3, wherein
the cam-follower drive mechanism of the measurement pressure mechanism includes a servo driver, a servo motor driven by the servo driver, a cam-follower drive shaft coupled to a ball screw driven by the servo motor, and a translation guide mechanism configured to horizontally guide the cam-follower drive shaft, the cam follower being provided on a tip of the cam-follower drive shaft; and
when driven to push down the pressure plate via the cam block, the measurement pressure mechanism pushes down the pressure plate against a tensile force of the spring mechanism.

6. The contact module of claim 1, wherein the vertical-shaft support mechanism includes a sensor configured to detect a lower limit position of the vertical-shaft unit when the pressure plate is lowered to a predetermined position.

7. The contact module of claim 1, wherein
an extension of the vertical shaft is set to pass substantially through a central portion of the pressure plate;
the pressure plate is hung by the vertical-shaft unit in two symmetrical hanging positions with respect to the central portion;
the cam block is provided on the pressure plate near the two hanging positions; and
the cam-follower drive mechanism includes a first and a second cam-follower drivers provided with respective cam followers;
wherein, when the cam followers are engaged with the cam block, a plurality of electronic components are pressed against respective measurement sockets by the pressure plate, simultaneously.

8. A method of driving a contact module, comprising:
lowering a contact plate from a measurement start position against an electronic component put in a measurement socket of an electronic-component measurement apparatus;
stopping lowering of the contact plate when the contact plate reaches a predetermined position immediately above the electronic component;
driving a cam-follower drive shaft to engage a cam follower with a cam slope of a cam block provided on the contact plate; and
stopping advancing of the cam-follower drive shaft when the contact plate presses, by means of the cam block, the electronic component against the measurement socket with a predetermined pressure.

9. A non-transitory computer-readable medium including a computer executable program, wherein the program, when executed by a computer, causes the computer to perform a method comprising:
vertically lowering a contact plate against an electronic component put in a measurement socket of an electronic-component measurement apparatus, at a measurement position of the electronic component;
stopping lowering of the contact plate when the contact plate reaches a predetermined position immediately above the electronic component;
driving a cam-follower drive shaft to engage a cam follower with a cam slope of a cam block provided on the contact plate; and
stopping advancing of the cam-follower drive shaft when the cam block causes the contact plate to press the electronic component against the measurement socket with a predetermined pressure.

* * * * *